US005677106A

United States Patent [19]

Burberry et al.

[11] Patent Number: 5,677,106

[45] Date of Patent: Oct. 14, 1997

[54] LITHOGRAPHIC PRINTING PLATES UTILIZING AN OLEOPHILIC IMAGING LAYER

[75] Inventors: Mitchell Stewart Burberry; Sharon Wheten Weber, both of Webster; Charles David DeBoer, Rochester, all of N.Y.

[73] Assignee: Eastman Kodak Company, Rochester, N.Y.

[21] Appl. No.: 698,829

[22] Filed: Aug. 16, 1996

Related U.S. Application Data

[60] Continuation of Ser. No. 397,299, Mar. 1, 1995, abandoned, which is a division of Ser. No. 260,652, Jun. 16, 1994, abandoned.

[51] Int. Cl.[6] .......... G03F 7/34

[52] U.S. Cl. .......... 430/253; 430/259; 430/262; 430/269; 430/273.1; 430/302; 430/944

[58] Field of Search .......... 430/269, 302, 430/253, 944, 259, 262, 273.1

[56] References Cited

U.S. PATENT DOCUMENTS

| | | | |
|---|---|---|---|
| 3,793,033 | 2/1974 | Mukherjee | 430/285.1 |
| 4,020,762 | 5/1977 | Peterson | 430/302 |
| 4,034,183 | 7/1977 | Uhlig | 219/121.85 |
| 4,054,094 | 10/1977 | Caddell et al. | 430/302 |
| 4,175,964 | 11/1979 | Uchida et al. | 430/253 |
| 4,288,520 | 9/1981 | Sprintschnik et al. | 430/302 |
| 4,334,006 | 6/1982 | Kitajima et al. | 430/254 |
| 4,555,475 | 11/1985 | Gamson et al. | 430/302 |
| 4,693,958 | 9/1987 | Schwartz et al. | 430/302 |
| 4,939,069 | 7/1990 | Kawabata et al. | 430/291 |
| 5,089,372 | 2/1992 | Kirihata et al. | 430/253 |
| 5,238,778 | 8/1993 | Hirai et al. | 430/200 |
| 5,308,739 | 5/1994 | Uytterhoeven et al. | 430/253 |
| 5,340,693 | 8/1994 | Uytterhoeven et al. | 430/253 |
| 5,372,907 | 12/1994 | Haley et al. | 430/157 |
| 5,491,046 | 2/1996 | DeBoer et al. | 430/302 |

FOREIGN PATENT DOCUMENTS

| | | |
|---|---|---|
| 0 573 091 | 12/1993 | European Pat. Off. . |
| 0 580 393 | 1/1994 | European Pat. Off. . |

*Primary Examiner*—John S. Chu
*Attorney, Agent, or Firm*—J. Lanny Tucker

[57] ABSTRACT

A lithographic printing plate is comprised of a support having a porous hydrophilic surface, such as grained and anodized aluminum, and an oleophilic imaging layer overlying the porous hydrophilic surface. The imaging layer is comprised of an oleophilic, radiation-absorbing, heat-sensitive, film-forming composition which is readily removable from the porous hydrophilic surface prior to imagewise exposure and which is adapted to form a lithographic printing surface as a result of imagewise exposure to absorbable electromagnetic radiation and subsequent removal of the non-exposed areas to reveal the underlying porous hydrophilic surface. Examples of suitable techniques for removing the non-exposed areas include contact with printing ink on the press, removal by lamination and peel development steps and removal by use of an integral stripping layer.

14 Claims, No Drawings

LITHOGRAPHIC PRINTING PLATES UTILIZING AN OLEOPHILIC IMAGING LAYER

This is a continuation of prior application Ser. No. 08/397,299, filed Mar. 1, 1995, now abandoned, which is a divisional of Ser. No. 08/260,652, now abandoned, filed Jun. 16, 1994.

FIELD OF THE INVENTION

This invention relates in general to lithographic printing and in particular to a novel lithographic printing plate comprising a hydrophilic support and an oleophilic imaging layer. More specifically, this invention relates to a novel lithographic printing plate which is capable of being imaged without the need for development with a developing solution.

BACKGROUND OF THE INVENTION

The art of lithographic printing is based upon the immiscibility of oil and water, wherein the oily material or ink is preferentially retained by the image area and the water or fountain solution is preferentially retained by the non-image area. When a suitably prepared surface is moistened with water and an ink is then applied, the background or non-image area retains the water and repels the ink while the image area accepts the ink and repels the water. The ink on the image area is then transferred to the surface of a material upon which the image is to be reproduced, such as paper, cloth and the like. Commonly the ink is transferred to an intermediate material called the blanket, which in turn transfers the ink to the surface of the material upon which the image is to be reproduced.

Aluminum has been used for many years as a support for lithographic printing plates. In order to prepare the aluminum for such use, it is typical to subject it to both a graining process and a subsequent anodizing process. The graining process serves to improve the adhesion of the subsequently applied radiation-sensitive coating and to enhance the water-receptive characteristics of the background areas of the printing plate.. The graining affects both the performance and the durability of the printing plate, and the quality of the graining is a critical factor determining the overall quality of the printing plate. A fine, uniform grain that is free of pits is essential to provide the highest quality performance.

Both mechanical and electrolytic graining processes are well known and widely used in the manufacture of lithographic printing plates. Optimum results are usually achieved through the use of electrolytic graining, which is also referred to in the art as electrochemical graining or electrochemical roughening, and there have been a great many different processes of electrolytic graining proposed for use in lithographic printing plate manufacturing. Processes of electrolytic graining are described, for example, in U.S. Pat. Nos. 3,755,116, 3,887,447, 3,935,080, 4,087,341, 4,201,836, 4,272,342, 4,294,672, 4,301,229, 4,396,468, 4,427,500, 4,468,295, 4,476,006, 4,482,434, 4,545,875, 4,548,683, 4,564,429, 4,581,996, 4,618,405, 4,735,696, 4,897,168 and 4,919,774.

In the manufacture of lithographic printing plates, the graining process is typically followed by an anodizing process, utilizing an acid such as sulfuric or phosphoric acid, and the anodizing process is typically followed by a process which renders the surface hydrophilic such as a process of thermal silication or electrosilication. The anodization step serves to provide an anodic oxide layer and is preferably controlled to create a layer of at least 0.3 $g/m^2$. Processes for anodizing aluminum to form an anodic oxide coating and then hydrophilizing the anodized surface by techniques such as silication are very well known in the art, and need not be further described herein.

Included among the many patents relating to processes for anodization of lithographic printing plates are U.S. Pat. Nos. 2,594,289, 2,703,781, 3,227,639, 3,511,661, 3,804,731, 3,915,811, 3,988,217, 4,022,670, 4,115,211, 4,229,266 and 4,647,346. Illustrative of the many materials useful in forming hydrophilic barrier layers are polyvinyl phosphonic acid, polyacrylic acid, polyacrylamide, silicates, zirconates and titanates. Included among the many patents relating to hydrophilic barrier layers utilized in lithographic printing plates are U.S. Pat. Nos. 2,714,066, 3,181,461, 3,220,832, 3,265,504, 3,276,868, 3,549,365, 4,090,880, 4,153,461, 4,376,914, 4,383,987, 4,399,021, 4,427,765, 4,427,766, 4,448,647, 4,452,674, 4,458,005, 4,492,616, 4,578,156, 4,689,272, 4,935,332 and European Patent No. 190,643.

The result of subjecting aluminum to an anodization process is to forman oxide layer which is porous. Pore size can vary widely, depending on the conditions used in the anodization process, but is typically in the range of from about 0.1 to about 10 micrometers. The use of a hydrophilic barrier layer is optional but preferred. Whether or not a barrier layer is employed, the aluminum support is characterized by having a porous wear-resistant hydrophilic surface which specifically adapts it for use in lithographic printing, particularly in situations where long press runs are required.

A wide variety of radiation-sensitive materials suitable for forming images for use in the lithographic printing process are known. Any radiation-sensitive layer is suitable which, after exposure and any necessary developing and/or fixing, provides an area in imagewise distribution which can be used for printing.

Useful negative-working compositions include those containing diazo resins, photocrosslinkable polymers and photopolymerizable compositions. Useful positive-working compositions include aromatic diazooxide compounds such as benzoquinone diazides and naphthoquinone diazides.

Lithographic printing plates of the type described hereinabove are usually developed with a developing solution after being imagewise exposed. The developing solution, which is used to remove the non-image areas of the imaging layer and thereby reveal the underlying porous hydrophilic support, is typically an aqueous alkaline solution and frequently includes a substantial amount of organic solvent. The need to use and dispose of substantial quantities of alkaline developing solution has long been a matter of considerable concern in the printing art.

Efforts have been made for many years to manufacture a lithographic printing plate which does not require development with an alkaline developing solution. Examples of the many patents and published patent applications relating to such prior efforts include:

(1) Mukherjee, U.S. Pat. No. 3,793,033, issued Feb. 19, 1974.

This patent describes a lithographic printing plate comprising a support and a hydrophilic imaging layer comprising a phenolic resin, an hydroxyethylcellulose ether and a photoinitiator. Upon imagewise exposure, the imaging layer becomes oleophilic in the exposed areas while remaining hydrophilic in the unexposed areas and thus can be used on a lithographic printing press, utilizing conventional inks and fountain solutions, without the need for a development step and consequently without the need for a developing solution.

(2) Uhlig, U.S. Pat. No. 4,034,183, issued Jul. 5, 1977.

This patent describes a lithographic printing plate comprising a support and a hydrophilic imaging layer that is imagewise exposed with laser radiation to render the exposed areas oleophilic and thereby form a lithographic printing surface. The printing plate can be used on a lithographic printing press employing conventional inks and fountain solutions without the need for a development step. If the hydrophilic imaging layer is water-insoluble, the unexposed areas of the layer serve as the image background. If the hydrophilic imaging layer is water-soluble the support which is used must be hydrophilic and then the imaging layer is removed in the unexposed areas by the fountain solution to reveal the underlying hydrophilic support.

(3) Caddell et al, U.S. Pat. No. 4,054,094, issued Oct. 18, 1977.

This patent describes a lithographic printing plate comprised of a support, a polymeric layer on the support, and a thin top coating of a hard hydrophilic material on the polymeric layer. A laser beam is used to etch the surface of the plate, thereby rendering it capable of accepting ink in the etched regions and accepting water in the unetched regions.

(4) Schwartz et al, U.S. Pat. No. 4,693,958, issued Sep. 15, 1987

This patent describes a lithographic printing plate comprising a support and a hydrophilic water-soluble heat-curable imaging layer which is imagewise exposed by suitable means, such as the beam of an infrared laser, to cure it and render it oleophilic in the exposed areas. The uncured portions of the imaging layer can then be removed by merely flushing with water.

(5) Hirai et al, U.S. Pat. No. 5,238,778, issued Aug. 24, 1993

This patent describes a method of preparing a lithographic printing plate utilizing an element comprising a support having thereon a heat transfer layer containing a colorant, a heat-fusible substance and a photo-curable composition. Heat is applied in an image pattern to transfer the image onto a recording material having a hydrophilic surface and the transferred image is exposed to actinic radiation to cure it.

(6) European Patent Application No. 0 573 091, published Dec. 8, 1993

This patent application describes a lithographic printing plate comprising a support having an oleophilic surface, a recording layer that is capable of converting laser beam radiation into heat, and an oleophobic surface layer. The recording layer and the oleophobic surface layer can be the same layer or separate layers. The printing plate is imagewise exposed with a laser beam and is then rubbed to remove the oleophobic surface layer in the exposed areas so as to reveal the underlying oleophilic surface and thereby form a lithographic printing surface.

(7) European Patent Application No. 0 580 393, published Jan. 26, 1994

This patent application describes lithographic printing plates intended to be imaged by means of laser devices that emit in the infrared region. Both wet plates that utilize fountain solution during printing and dry plates to which ink is applied directly are described. Laser output either ablates one or more layers or physically transforms a surface layer whereby exposed areas exhibit an affinity for ink or an ink-abhesive fluid, such as fountain solution, that differs from that of unexposed areas.

Lithographic printing plates designed to eliminate the need for a developing solution which have been proposed heretofore have suffered from one or more disadvantages which have limited their usefulness. For example, they have lacked a sufficient degree of discrimination between oleophilic image areas and hydrophilic non-image areas with the result that image quality on printing is poor, or they have had oleophilic image areas which are not sufficiently durable to permit long printing runs, or they have had hydrophilic non-image areas that are easily scratched and worn, or they have been unduly complex and costly by virtue of the need to coat multiple layers on the support.

It is toward the objective of providing an improved lithographic printing plate that requires no alkaline developing solution, that is of simple and inexpensive construction, and which overcomes many of the limitations and disadvantages of the prior art that the present invention is directed.

SUMMARY OF THE INVENTION

In accordance with this invention, a lithographic printing plate is comprised of a support having a porous hydrophilic surface and an oleophilic imaging layer overlying the porous hydrophilic surface. The imaging layer is comprised of an oleophilic, radiation-absorbing, heat-sensitive, film-forming composition which is readily removable from the porous hydrophilic surface prior to imagewise exposure and which is adapted to form a lithographic printing surface as a result of imagewise exposure to absorbable electromagnetic radiation and subsequent removal of the non-exposed areas to reveal the underlying porous hydrophilic surface. The imagewise exposure effects localized generation of heat in the exposed areas of the imaging layer sufficient to cause said exposed areas to interact with the porous hydrophilic surface and bond strongly thereto so as to provide a durable oleophilic image that is useful in lithographic printing.

A key aspect of the present invention is the use of an imaging layer which is oleophilic. By use of such an imaging layer, the need to convert the imaging layer from a hydrophilic state to an neophilic state by imagewise exposure is avoided. In contrast, such conversion is required with prior art printing plates such as those described in the aforementioned U.S. Pat. Nos. 3,793,033, 4,034,183 and 4,693,958 in which the imaging layer is hydrophilic prior to exposure. In the present invention, the function of the exposing step is to strongly bond the oleophilic imaging layer to the underlying porous hydrophilic surface in the exposed areas and thereby produce a durable oleophilic image that is useful in printing. Because the imaging layer used in this invention is oleophilic prior to imagewise exposure, it does not have a strong affinity for the underlying porous hydrophilic surface and, in consequence, is readily removable therefrom in the non-exposed areas.

A second key aspect of the present invention is the use of a support which has a porous hydrophilic surface. In particular, a porous surface is required in order to achieve the necessary strong bonding of the oleophilic image layer to the support in the exposed areas. While Applicants do not wish to be bound by any theoretical explanation of the manner in which their invention functions, it is believed that the localized heating which results from imagewise exposure to absorbable electromagnetic radiation drives the oleophilic composition into the pores of the support material to strongly anchor it. In any event, it has been established that the imagewise heating brings about an interaction with the porous hydrophilic surface such that the oleophilic material, which is readily removable before exposure, is strongly bonded after exposure. The oleophilic character exhibited by the imaging layer prior to exposure is retained after exposure, as the function of the exposure is merely to change the strength with which the image layer material adheres to the porous hydrophilic support. In other words, the function of the exposure step is to fix the image in place.

Preferred support materials for use in this invention are the anodized aluminum supports which are widely used with conventional lithographic printing plates. Examples of suitable supports include aluminum which has been anodized without prior graining, aluminum which has been grained and anodized, and aluminum which has been grained, anodized and coated with a hydrophilic barrier layer such as a silicate layer. In the present invention, the imaging layer is removed in the non-exposed areas to reveal the underlying porous hydrophilic surface. Thus, the invention is able to make use of the excellent wear characteristics of an anodized aluminum surface. In contrast, prior art lithographic printing plates which require a support with an oleophilic surface, such as those described in European Patent Application No. 0 573 091, can use an aluminum support only by providing an oleophilic overcoat layer on the aluminum support and such overcoat layers are readily worn away and may be subject to scratching.

The lithographic printing plates of this invention, in contrast with the complex and costly multilayer plates of European Patent Application No. 0 580 393, are of simple construction requiring only a support with a porous hydrophilic surface and an oleophilic imaging layer overlying such surface.

The lithographic printing plates of this invention are capable of providing very sharp images. In contrast, printing plates formed by transfer methods, such as those described in U.S. Pat. No. 5,238,778, can suffer from "point spread" or blurring since material must migrate through a gap between donor and receiver elements.

The lithographic printing plates of this invention can be imaged by any of various techniques. The plates are heat-sensitive in the sense that heat generated in the exposed areas brings about the desired strong bonding to the porous hydrophilic surface of the support. The essential requirement is to provide sufficient absorbable electromagnetic radiation to generate the necessary heat. Thus, the plates can be imaged by exposure through a negative transparency or can be exposed from digital information such as by the use of a laser beam. Preferably, the plates are directly laser-written and most preferably are directly laser-written by a laser that emits in the infrared.

With the lithographic printing plates described herein, processing that requires the use of an alkaline developing solution is not necessary. The oleophilic imaging layer of this invention can be formulated to be soluble, prior to exposure, in lithographic printing ink. Thus, to provide a simple and convenient way of removing the non-image areas, the imagewise exposed plate can be mounted on the lithographic printing press and the flow of ink can be started and continued for a sufficient time to remove the non-exposed areas of the imaging layer and reveal the underlying porous hydrophilic surface. Once such removal is complete, printing can be continued with the conventional use of both printing ink and fountain solution. Other techniques for removing the non-exposed areas of the imaging layer that are suitable include rubbing off such areas or removing such areas by contacting the imagewise exposed plate with a tacky sheet material that will pull away the non-exposed areas without adversely affecting the strongly bonded exposed areas. The areas of the imaging layer that have not been subjected to exposure are easily and cleanly removed from the underlying porous hydrophilic surface by use of this technique.

In a particularly preferred embodiment of the invention, a lithographic printing plate is comprised of a support having a porous hydrophilic surface, an oleophilic imaging layer as described herein overlying such surface and an integral stripping layer, that is transparent to the electromagnetic radiation that is used to expose the plate, overlying the imaging layer. After imagewise exposure, the stripping layer is pulled off and the non-exposed areas adhere to the stripping layer while the exposed areas adhere to the support. Exposure is carried out through the stripping layer so it must exhibit the necessary degree of transparency to the radiation that is employed. To facilitate stripping, means such as a pull tab can be provided. This technique is commonly referred to as "peel development" and is well known in the graphic arts and described in many patents such as, for example, U.S. Pat. No. 4,334,006.

DESCRIPTION OF THE PREFERRED EMBODIMENTS

The support employed in the lithographic printing plates of this invention can be any support material which provides a porous hydrophilic surface. As indicated hereinabove, it is particularly preferred to use anodized aluminum, with or without a hydrophilic barrier layer over the anodic layer, as the support. An anodized aluminum support is preferred because of its affinity for the fountain solution used on a printing press and because it is extremely wear-resistant. Particularly preferred is an aluminum plate which has been both grained and anodized.

The degree of porosity and size of the pores at the surface of the support material is not critical and any level of porosity and pore size which will provide an adequate bond with the exposed imaging layer is useful. Typically, the hydrophilic porous surface is characterized by the presence of pores with a size in the range of from about 0.1 to about 10 micrometers.

In addition to aluminum, other metals which are high enough in the electromotive series to accept water, such as, for example, chromium or stainless steel can be used as the support material. To provide the necessary porosity at the surface, the metal can be roughened by well-known techniques such as, for example, brush graining, grit blasting or electrolytic etching in a hydrochloric, nitric, sulfuric or phosphoric acid bath. Supports comprised of a laminate of aluminum with paper, metal or a polymeric resin are also useful.

A suitable thickness for the support material is in the range of from about 0.1 to about 1 millimeters, and more preferably in the range of from about 0.1 to about 0.3 millimeters.

The imaging layer employed in the lithographic printing plate of this invention is comprised of an oleophilic, radiation-absorbing, heat-sensitive, film-forming composition and typically has a thickness in the range of from about 0.0003 to about 0.02 millimeters and more preferably in the range of from about 0.001 to about 0.003 millimeters.

In contrast with conventional lithographic printing plates, the imaging layer utilized in the novel lithographic printing plates of this invention need not be radiation-sensitive since imaging is achieved not by photopolymerization or photo-crosslinking or photosolubilization but by heat fixing.

It is particularly advantageous for the imaging layer to be capable of absorbing infrared radiation and thus capable of being imaged by exposure to a laser which emits in the infrared. A suitable procedure for forming such an imaging layer is to coat the support with an organic solvent solution of a solvent-soluble water-insoluble polymer binder and a solvent-soluble water-insoluble infrared absorber, such as a dye that absorbs in the infrared. The polymeric binder is selected to promote controllable adhesion and image discrimination. Polymers which flow readily when heated are particularly effective. A plasticizer can also be incorporated in the composition to promote controllable and differential adhesion.

Examples of suitable polymeric binders include cellulosic polymers such as nitrocellulose, hyroxyethyl cellulose and cellulose acetate propionate; polyurethanes; polycarbonates such as bisphenol-A polycarbonate; acrylates such as poly (methyl methacrylate) and polycyanoacrylate; polyesters; poly(vinyl acetate); polyacetals such as poly(vinyl butyral) and poly(vinyl alcohol-co-butyral) and styrenes such as poly(-methylstyrene).

The imaging layer of this invention is heat-sensitive in that localized heating of the layer resulting from imagewise exposure to suitable electromagnetic radiation, such as infrared radiation from a laser, causes the exposed area to interact with the underlying porous hydrophilic surface and become strongly bonded thereto. The exact nature of this interaction is not presently understood.

Incorporation of an infrared absorber in the imaging layer renders it sensitive to infrared radiation and makes the printing plate useful as a direct-laser-addressable plate which can be imaged by exposure to a laser which emits in the infrared region. The infrared absorber can be a dye or pigment. A very wide range of such compounds is well known in the art and includes dyes or pigments of the squarylium, croconate, cyanine, merocyanine, indolizine, pyrylium and metal dithiolene classes.

Additional infrared absorbers that are of utility in this invention include those described in U.S. Pat. No. 5,166,024, issued Nov. 24, 1992. As described in the '024 patent, particularly useful infrared absorbers are phthalocyanine pigments.

Examples of preferred infrared-absorbing dyes for use in this invention are the following:

IR-1

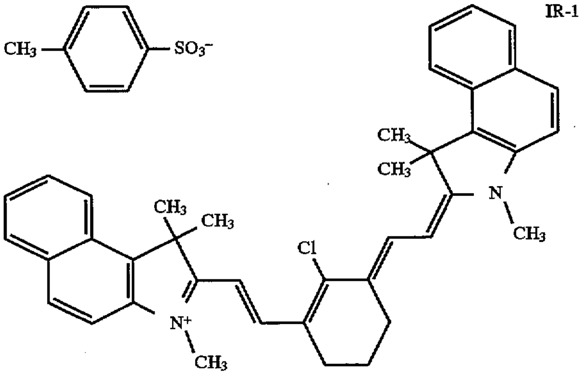

2-[2-[2-chloro-3-[(1,3-dihydro-1,1,3-trimethyl-2H -benz[e] indol-2-ylidene)ethylidene-1-cyclohexe-1-yl]ethenyl]-1,1,3-trimethyl-1H-benz[e]indolium salt with 4-methylbenzenesulfonic acid

IR-2

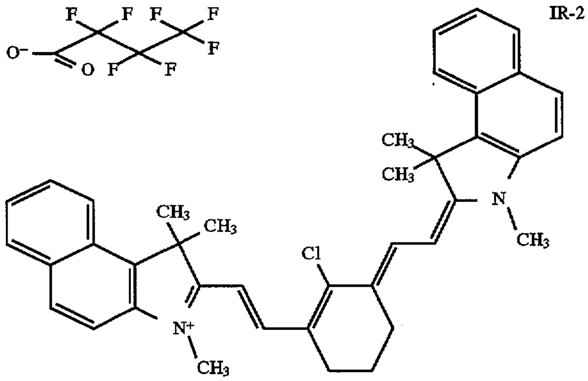

2-[2-[2-chloro-3-[(1,3-dihydro-1,1,3-trimethyl-2H -benz[e] indol-2-ylidene)ethylidene-1-cyclohexe-1 -yl]ethenyl-1,1,3-trimethyl-1H-benz[e]indolium salt with heptafluorobutyrate

IR-3

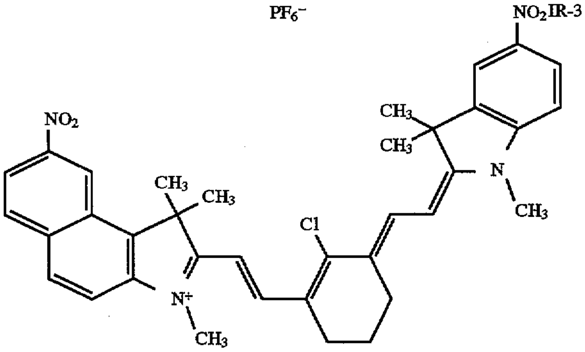

2-(2-(2-chloro-(3-(1,3-dihydro-1,3,3-trimethyl-5-nitro -2H-indol-2-ylidene)ethylidene)-1-cyclohexene-1-yl)ethenyl)-1,3,3-trimethyl-5-nitro-3H-indolium hexafluorophosphate

IR-4

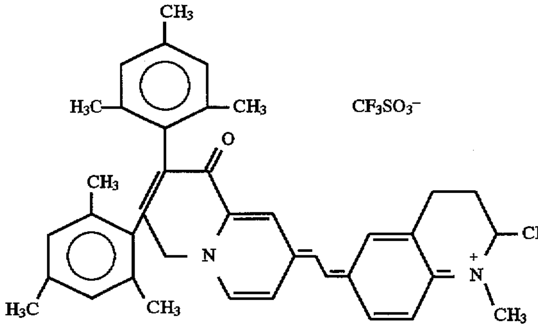

2,3,4,6-tetrahydro-1,2-dimethyl-6-[[1-oxo-2,3-bis(2,4,6-trimethylphenyl)-7(1H) -indolizinylidene]ethylidene] quinolinium trifluoromethanesulfonate.

While it is preferred to image the printing plates of this invention by using a laser that emits in the infrared, other sources of suitable electromagnetic radiation can also be used. Examples include Nd:YAG lasers, $CO_2$ lasers, argon-ion lasers, kripton-ion lasers, excimer lasers, nitrogen lasers, He-Ne lasers, He-Cd lasers, dye lasers and high intensity rare gas flash lamps.

The imaging layer of this invention is typically prepared by dispersing a radiation-absorbing agent in a film-forming polymer binder as described hereinabove. This is not the only way of meeting the requirements of this invention however. The essential requirement is that the imaging layer be comprised of an oleophilic radiation-absorbing material such that, upon imagewise radiational heating, it is fixed to the underlying porous hydrophilic surface of the support and can no longer be easily removed. Thus, an alternative to use of an infrared-absorbing agent dispersed in a polymeric film-forming binder is to use a film-forming polymer having substituent groups on the polymer chain which are infrared absorbing.

By the term "easily removable", as used herein, is meant removable by simple techniques such as peeling the unexposed areas of the imaging layer away from the porous hydrophilic surface or removing the unexposed areas by gently rubbing with an organic liquid composition such as a printing ink.

By the term "heatisensitive" as used herein, is meant capable of interacting, by chemical and/or physical means, with the porous hydrophilic surface of the support as a result of the generation of heat so as to leave a strongly bonded oleophilic image thereon.

The term "integral stripping layer", as used herein, refers to a layer that is applied in manufacture of the printing plate and thereby forms an integral part of the printing plate and that can be stripped off to thereby effect peel development of the imaging layer.

It is an important advantage of this invention that the printing plate can be directly imaged from digital information, thereby eliminating the time, handling, storage and expense of film intermediates. It is a further important advantage of this invention that the printing plate can be designed to be handleable in roomlight, to thereby faciliate use in a printing system of simplified design and to minimize operator fatigue. It is a still further important advantage of the printing plates of this invention that, in the preferred embodiment, they are sensitized to infrared wavelengths so that the print engine can use diode lasers that are reliable and relatively inexpensive.

In using an anodized aluminum support in this invention, an optional, but preferred, step is to treat the surface of the anodic layer with a surfactant solution for the purpose of promoting controllable adhesion. For example, the surface can be treated with an aqueous solution of a plasticizer, such as triethanolamine, and a surfactant, such as a polyglycidol ether surfactant, and then dried prior to coating of the imaging layer. In one preferred embodiment of the invention, a water-compatible infrared-absorbing dye is added to the treating solution to enhance the absorption of infrared radiation.

In a particular embodiment of the present invention, the printing plate is imagewise exposed to laser radiation and then mounted directly on an offset printing press. The unexposed areas of the imaging layer are removed by the inking and printing process after only a few impressions while ink remains only in the exposed areas.

In another embodiment, the laser-exposed plate is laminated to a sheet of paper or a sheet of polymeric film that has been coated with an adhesive and the laminated sheet is then peeled away to remove unexposed portions of the oleophilic imaging layer while leaving ink-accepting material only in the exposed areas.

In yet another embodiment, the plate includes an integral stripping layer overlying the imaging layer and this stripping layer is transparent to the laser radiation. The stripping layer acts as a protective barrier during handling of the plate. It is referred to herein as an "integral" stripping layer since it is coated or laminated as part of the manufacture of the plate. After imagewise exposure, the integral stripping layer is peeled away, thereby removing the unexposed areas of the imaging layer and leaving ink-accepting material only in the exposed areas.

A very wide variety of materials can be employed to form the integral stripping layer. Among the requirements for an effective stripping layer are (1) that it can be coated or laminated from a composition that does not dissolve or attack the underlying imaging layer, (2) that it can be coated or laminated in the form of a strong cohesive film so that the unexposed regions of the imaging layer can be easily peeled off after the imagewise exposure, and (3) that it does not react adversely with any of the components of the imaging layer during the imagewise exposure step.

The integral stripping layer utilized in this invention can be formed from any film-forming polymer that can be coated from an aqueous or organic solvent solution that does not attack the underlying image-forming layer. Examples of suitable film-forming polymers include polymers soluble in non-polar solvents such as hexane, for example, polyisobutylene, polyisoprene, polybutadiene, and polymethylpentene; polymers soluble in water, such as polyvinylalcohol, gelatin, co-polyacrylamide-polyaminoethylmethacrylate hydrochloride, polyvinylimidazole, and polyvinylpyrrollidone; and polymers which can either be dispersed in water or emulsion polymerized in water, such as polymethylmethacrylate, polybutylacrylate, polyvinylacetate, polyethylhexylacrylate, polyhexylmethacrylate, polyoctadecylmethacrylate, and polyvinylpropionate. The integral stripping layer can be removed manually or by the use of a suitable mechanical device.

An example of a particularly useful printing plate within the scope of the present invention is a plate comprising (1) a support having a porous hydrophilic surface, (2) a hydrophilic subbing layer overlying the support, (3) an oleophilic imaging layer overlying the subbing layer which strongly absorbs infrared radiation and (4) an integral stripping layer which is permeable to infrared radiation overlying the image-forming layer.

It is preferred in this invention to expose the imaging layer to a laser beam at approximately 830 nanometers. As a result of such exposure, the imaging layer is rapidly heated and the action of the laser beam brings about the desired interaction of the imaging layer with the underlying porous hydrophilic support surface. The products formed in the exposed areas adhere tenaciously to the underlying porous hydrophilic surface while the unexposed regions remain unaffected and are, therefore, easily removable. The image produced by the action of the laser beam is of high contrast and readily observable. For example, in using an imaging layer containing an infrared-absorbing agent that renders it bright green, the exposed regions turn to a light yellow-brown color while the unexposed regions remain bright green. When the exposed plate is contacted with printing ink, for example by rubbing ink on it with a cloth or inking the Surface on a conventional offset printing press, the ink adheres to the laser-exposed regions while the unexposed regions are wiped clean by the ink, thereby leaving the water-accepting porous hydrophilic surface of the support free of residual coating and free of ink. High quality printed images can be obtained after only a few start-up impressions are run. Adjusting the printing press with the aid of a number of start-up impressions is a common practice in the offset printing industry so use of the printing plate of this invention does not require any additional steps or additional effort.

In that embodiment of the invention in which there is no integral stripping layer overlying the imaging layer, the action of the laser beam is believed to cause partial ablation, partial melting, partial vaporization and partial decomposition. Similar results are believed to occur when the exposure is through an integral stripping layer except that vapors are not able to escape.

The printing plates of this invention require relatively low power exposures compared to laser plate-making processes heretofore known to the art. This is one of the most important advantages of the invention. A suitable print engine for use with the printing plates of this invention is a thermal printer which uses a laser to form an image on a thermal medium as described in Baek and DeBoer, U.S. Pat. No. 5,168,288, the disclosure of which is incorporated herein by reference. In the working examples which follow, a print engine as described in the '288 patent was utilized. This print engine is characterized by the following features: twelve channels, 100 mW per channel, 700 lines per centimeter, 200 rpm and approximately 25 μm spot size. The test image employed included positive and negative text, positive and negative lines, half-tone dot patterns and half-tone images.

The exposure to infrared radiation must be closely controlled to provide the appropriate amount of heat generation. Excessive heating will remove all of the imaging layer by ablation. Insufficient heating will result in insufficient bonding of the imaging layer to the support. In using infrared exposure, it is preferred to provide an energy input in the range of from about 50 to about 5000 millijoules per square centimeter (mJ/cm$^2$), The use in this invention of a porous hydrophilic support which is metallic is especially advantageous in that it provides a particularly durable background area which facilitates long press runs.

As hereinabove described, the printing plates of this invention are adaptable to the use of a variety of techniques to remove the non-exposed areas and reveal the underlying porous hydrophilic surface of the support. Any method of removing such non-exposed areas is considered as coming within the scope of the invention. Examples of suitable methods include contact with printing ink, removal by lamination and peel development steps and removal by use of an integral stripping layer.

As hereinabove described, in a particularly preferred embodiment of the present invention, the lithographic printing plate is provided with an integral stripping layer that overlies the imaging layer. This layer serves as a protective layer but its primary function is to provide a convenient means for effecting peel development. Thus, after the imagewise exposure step is completed, the integral stripping layer is peeled off to thereby remove the unexposed areas of the imaging layer and reveal the underlying porous hydrophilic surface of the support. The unexposed areas are easily and cleanly removed and the ease of removal and sharpness of the separation is at least in part attributable to the fact that the imaging layer, being oleophilic, has little affinity for the hydrophilic surface.

It is an important advantage of this invention, that the unexposed regions of the imaging layer are entirely removed to reveal the underlying support since the support then serves as the background areas in the printing operation and use of a material such as anodized aluminum for the support provides a very durable and long lasting surface. In contrast, many prior art processes for utilizing lithographic printing plates without employing an alkaline developing solution are dependent on converting a hydrophilic layer to an oleophilic image by exposure and utilize the unexposed portions of such hydrophilic layer as the background areas in printing. Such a hydrophilic layer will not be nearly as durable and long lasting as an anodized aluminum layer. Other prior art processes require the application of multiple coatings over the support and also are not capable of utilizing the support itself to serve as the background for printing.

The oleophilic imaging layer of this invention is Water-insoluble and therefore is not removable by use of fountain solution. It is, however, readily removable prior to exposure by use of lithographic printing ink or other suitable organic solvent-based composition. The infrared-absorbing dyes utilized in the imaging layer are water-insoluble and ink-accepting. The integral stripping layer is designed to be removable at room temperature so no heating step is needed to accomplish peel development by use of such stripping layer. The use of a subbing layer over the porous hydrophilic support surface is optional but is frequently advantageous in facilitating clean removal of the non-exposed areas from the support. In using the technique of lamination and peel development in place of an integral stripping layer, the imagewise exposure step can take place before or after the lamination step.

In the examples which follow, the support material used to prepare the printing plate was a 0.14 mm thick aluminum sheet that had been electrolytically grained and anodized and had a porous anodic layer with an oxide mass of 2.5 g/m$^2$ that had been treated with a sodium silicate solution.

The materials used in the working examples which follow and the sources from which they were obtained are summarized in Table I below.

TABLE I

| Material | Description | Source |
|---|---|---|
| IR-1 | infrared absorbing dye | Eastman Kodak Company |
| IR-2 | infrared absorbing dye | Eastman Kodak Company |
| IR-3 | infrared absorbing dye | Eastman Kodak Company |
| IR-4 | infrared absorbing dye | Eastman Kodak Company |
| IR-5 | organic-solubilized Cu-phthalocyanine | ICI |
| TEA | triethanolamine | Eastman Kodak Company |
| 10-G | Surfactant 10-G* | Olin Corporation |
| NC | nitrocellulose (1130 sec viscosity) | Hercules |
| CAP 482-20 | cellulose acetate propionate (20 sec viscosity) | Eastman Kodak Company |
| CAP 482-5 | cellulose acetate propionate (0.5 sec viscosity) | Eastman Kodak Company |
| LEXAN-101 | bisphenol-A polycarbonate | General Electric |
| PMMA | poly(methyl methacrylate) | Aldrich |
| BUTVAR-76 | poly(vinyl alcohol-co-butyral) | Monsanto Company |
| α-MPS | poly(α-methylstyrene) | SP$^2$ |
| p-SIC-85 | polycyanoacrylate | Henkel |
| AQUAZAR | polyurethane | United Gilsonite |
| AQ-38 | water-dispersible polyester | Eastman Kodak Company |
| VINAC | poly(vinyl acetate) | Air Products Corp. |
| NATROSOL | hydrxoyethyl cellulose | Aqualon Company |

*Trademark of Olin Corporation for p-isononylphenoxypolygycidol.

In the working examples which follow, use of a "surfactant-sub" refers to the following procedure:

A 50-Gram aqueous solution containing 4 drops of 10-G and 4 drops of TEA is coated on the support surface in an amount of 0.054 G/m$^2$ (wet laydown) and dried at 49° C. for 5 minutes.

The invention is further illustrated by the following examples of its practice.

EXAMPLE 1

The anodized aluminum support described hereinabove was pretreated with surfactant-sub, then coated with an acetone solution containing NC and IR-1 and then dried at 49° C. for 5 minutes. The dry coverage was 2.15 G/m$^2$ NC and 0.71 G/m$^2$ IR-1. Imagewise exposure with the test image was carried out using the print engine described hereinabove at both 100 and 200 rpm, corresponding to a maximum area exposure of 600 and 300 mJ/cm$^2$, respectively.

Following imagewise exposure, the plate was Glued, face up, to a large sheet of aluminum and mounted on a Miehle Press. A solid rollup was performed and twenty sheets were printed before turning on the water. Approximately 125 sheets were printed before the ink was turned off and only fountain solution was touching the plate for another 50 sheets. Then the ink supply was re-established and an additional 25 sheets were printed. At this time, the water was stopped and solid rollup occurred for an additional 25 sheets. Water was reapplied and the run was continued for a total of 350 sheets. Good quality prints were obtained.

EXAMPLE 2

Example 1 was repeated but with a dry coverage of 0.538 g/m$^2$ NC and 0.269g/m$^2$ IR-1. Similar results were obtained.

EXAMPLE 3

Example 1 was repeated but with a dry coverage of 1.345 g/m$^2$ NC and 0.441 g/m$^2$ IR-1. Similar results were obtained.

EXAMPLE 4

This example was similar to Example 1 but with a dry coverage of 0.323 g/m$^2$ NC and 0.161 g/m$^2$ IR -1 and exposure at 200 rpm only. After exposure, the plate was dry processed by laminating, at room temperature, with 3M SCOTCH adhesive tape and then peeling the tape from the plate to remove unexposed areas while leaving exposed areas on the support. The plate was then fastened to a carrier and mounted on a lithographic printing press. A test was performed by wetting the plate with the dampening rollers for approximately100 cylinder revolutions and then stacking the paper. Application of the ink brought about a quick rollup. Approximately 500 sheets were printed with no change after the first 100 sheets. After 500 sheets the water was turned off and the plates allowed to rollup and water was then reapplied. The results were the same as with the first 100 sheets.

EXAMPLE 5

Example 4 was repeated but without triethanolamine in the surfactant-sub. Similar results were obtained.

EXAMPLE 6

Example 4 was repeated but without the surfactant-sub treatment. Similar results were obtained.

EXAMPLE 7

This example was similar to Example 1 but with a dry coverage of 0.324 g/m$^2$ NC and 0.162 g/m$^2$ IR -1 and with drying at 27° C. for 3 minutes exposed in the manner described in Example 1 and subjected to two tests as follows:

A differential peel test was carried out by laminating the exposed plate with 3M SCOTCH adhesive tape and stripping. Discrimination was judged to be "excellent" if the unexposed areas stripped off easily while leaving the exposed areas behind. Examples were judged to be "good" if most unexposed areas stripped off while exposed areas remained. Examples were judged to be "fair" if some discrimination occurred but stripping of unexposed areas was difficult or much of the exposed area was removed. Examples were judged to be "poor" if no discrimination occurred either because unexposed areas could not strip or exposed areas stripped off completely.

A differential inking test was carried out by rubbing the exposed plate with black printers ink using a soft cloth. Images were judged to have "excellent" ink discrimination if unexposed areas were wiped off readily leaving ink behind in exposed areas. A "good" rating indicated that differentiation required considerable rubbing. A "fair" rating indicated that ink partially adhered to exposed areas but some inking of the unexposed areas also occurred. Results were judged to be "poor" if ink adhered over the entire surface without discrimination between exposed and unexposed areas.

This example exhibited good differential peel and good differential inking.

EXAMPLE 8

Example 7 was repeated but with IR-2 in place of IR-1. Differential peel and differential inking were both good.

EXAMPLE 9

Example 7 was repeated but with IR-3 in place of IR-1. Differential peel and differential inking were both good.

EXAMPLE 10

This example was similar to Example 1 except that the anodized aluminum support was pretreated with distilled water and dried at 49° C. for 5 minutes. The dry coverage was 0.324 g/m$^2$ NC and 0.162 g/m$^2$ IR-1 and the coating was dried at 27° C. for 3 minutes. The plate was imagewise exposed at 200 rpm and exposed samples were subjected to the differential peel test and differential inking test described hereinabove. Results obtained are reported in Table II below.

EXAMPLE 11

Example 10 was repeated except that the anodized aluminum support was pretreated with a solution consisting of 4 drops of 10-G in 50 grams of water coated at 0.054 g/m$^2$ (wet laydown) and dried at 49° C. for 5 minutes. Results obtained are reported in Table II below.

EXAMPLE 12

Example 10 was repeated except that the anodized aluminum support was pretreated with a solution consisting of 8 drops of triethanolamine in 50 grams of water coated at 0.054 g/m$^2$ (wet laydown) and dried at 49° C. for 5 minutes. Results obtained are reported in Table II below.

EXAMPLE 11

Example 10 was repeated except that the anodized aluminum support was pretreated with a solution consisting of 4 drops of 10-G and 8 drops of triethanolamine in 50 grams of water coated at 0.054 g/m$^2$ (wet laydown) and dried at 49° C. for 5 minutes. Results are reported in Table II below.

EXAMPLE 14

Example 10 was repeated except that the anodized aluminum support was pretreated with a solution consisting of 4 drops of 10-G and 4 drops of triethanolamine in 50 grams of water coated at 0.054 g/m$^2$ (wet laydown) and dried at 49° C. for 5 minutes. Results obtained are reported in Table II below.

EXAMPLE 15

Example 10 was repeated except that the anodized aluminum support was heated prior to coating and no surfactant-sub was employed. Results obtained are reported in Table II below.

TABLE II

| Example No. | Differential Peel Rating | Differential Inking Rating |
|---|---|---|
| 10 | Good | Excellent |
| 11 | Good | Excellent |
| 12 | Good | Excellent |
| 13 | Good | Excellent |
| 14 | Excellent | Excellent |
| 15 | Poor | Poor |

EXAMPLES 16–22

Each of these examples utilized a surfactant-sub and a dry coverage of NC and IR-1 as indicated in Table III below. In each case, the plate was imaged and tested for both peel and inking. Test results are summarized in Table III and are assigned a rank order in which a ranking of 1 is best and a ranking of 7 is worst.

TABLE III

| Example No. | NC ($g/m^2$) | IR-1 ($g/m^2$) | Differential Peel Rating | Differential Inking Rating |
|---|---|---|---|---|
| 16 | 0.648 | 0.324 | 1-Good | 5-Fair |
| 17 | 0.324 | 0.162 | 4-Fair | 4-Fair |
| 18 | 0.324 | 0.108 | 2-Fair | 3-Fair |
| 19 | 0.324 | 0.054 | 3-Fair | 1-Fair |
| 20 | 0.216 | 0.162 | 5-Poor | 2-Fair |
| 21 | 0.162 | 0.081 | 7-Poor | 7-Poor |
| 22 | 0.108 | 0.162 | 6-Poor | 6-Poor |

The results reported in Table III indicate that thicker coatings tend to give the best results.

EXAMPLES 23–28

These examples utilized amounts of NC and IR-as indicated in Table IV below. As also indicated in Table IV, some of the examples employed a surfactant-sub and others did not.

TABLE IV

| Example No. | Surfactant-sub | NC ($g/m^2$) | IR-1 ($g/m^2$) | Differential Peel Rating | Differential Inking Rating |
|---|---|---|---|---|---|
| 23 | No | 0.648 | 0.324 | Poor | Fair |
| 24 | No | 1.296 | 0.648 | Fair | Good |
| 25 | No | 2.592 | 1.296 | Good | Good |
| 26 | Yes | 0.648 | 0.324 | Fair | Fair |
| 27 | Yes | 1.296 | 0.648 | Good | Good |
| 28 | Yes | 2.592 | 1.296 | Good | Good |

The results reported in Table IV indicate that better discrimination occurs with thicker layers and with plates that have been surfactant subbed.

EXAMPLES 29–36

These examples illustrate the use of different polymeric binders and different organic solvents for forming the imaging layer. In each case, a surfactant-sub was employed and the coating provided 0.648 $g/m^2$ of polymeric binder and 0.324 $g/m^2$ of IR-1. Results obtained are reported in Table V.

TABLE V

| Example No. | Binder | Solvent | Differential Peel Rating | Differential Inking Rating |
|---|---|---|---|---|
| 29 | NC | Acetone | Excellent | Good |
| 30 | CAP 482-20 | Acetone | Good | Good |
| 31 | CAP-482-5 | Acetone | Good | Good |
| 32 | LEXAN-101 | Dichloro-methane | Poor | Poor |
| 33 | PMMA | Acetone | Poor | Poor |
| 34 | BUTVAR-76 | Acetone | Fair | Good |
| 35 | α-MPS | Dichloro-methane | Poor | Poor |
| 36 | p-SIC-85 | Aceto-nitrile | Poor | Poor |

The results reported in Table V indicate that a wide variety of polymers can be used as a film-forming polymeric binder in the imaging layer. Particularly good results are obtained with the use of nitrocellulose.

EXAMPLES 37–41

These examples illustrate the use of different subbing treatments for the anodized aluminum support. The material used to form the subbing coat and the amount employed in $g/m^2$ are summarized in Table VI below. In each case, the imaging layer was coated to provide 0.648 $g/m^2$ of NC and 0.324 $g/m^2$ of IR-1.

TABLE VI

| Example No. | Subbing | Amount of Subbing ($g/m^2$) | Differential Peel Rating | Differential Inking Rating |
|---|---|---|---|---|
| 37 | Surfactant-sub | — | Excellent | Excellent |
| 38 | AQUAZAR | 1.080 | Fair | Fair |
| 39 | AQ-38 | 1.080 | Fair | Fair |
| 40 | VINAC | 0.648 | Poor | Poor |
| 41 | NATROSOL | 0.270 | Fair | Poor* |

*This example resulted in reversed discrimination, i.e., ink adhered to unexposed areas but not to exposed areas.

The results reported in Table VI indicate that particularly good performance is achieved with the use of the surfactant-sub.

EXAMPLES 42–43

These examples illustrate the effect of electrolytic graining of the aluminum support on the performance of the printing plate. In Example 42, the support was an anodized but non-grained aluminum obtained from DaiNippon Screen. In Example 43, the support was the electrolytically grained and anodized aluminum used in all other examples herein. In each instance, the support was coated with 1.30 $g/m^2$ NC and 0.648 $g/m^2$ IR-1. In Example 42, both the differential peel rating and the differential inking rating were poor whereas in Example 43 both were excellent, thereby illustrating that much better performance is achieved by the use of grained aluminum. This is believed to be due to the greatly enhanced porosity resulting from graining.

EXAMPLE 44

In this example, the grained and anodized aluminum support was treated with surfactant-sub, then coated with an acetone solution to obtain a dry coverage of 0.648 g/m$^2$ NC and 0.324 g/m$^2$ IR-1 and dried at 27° C. for 3 minutes. The plate was exposed with the print engine at 100 rpm and subjected to both the differential peel test and the differential ink test. Results obtained are reported in Table VII.

EXAMPLE 45

Example 44 was repeated except that IR-2 was substituted for IR-1. Results obtained are reported in Table VII.

EXAMPLE 46

Example 44 was repeated except that IR-3 was substituted for IR-1. Results obtained are reported in Table VII.

EXAMPLE 47

Example 44 was repeated except that IR-4 was substituted for IR-1. Results obtained are reported in Table VII.

EXAMPLE 48

Example 44 was repeated except that IR-5 was substituted for IR-1. Results obtained are reported in Table VII.

TABLE VII

| Example No. | Infrared Absorber | Differential Peel Rating | Differential Inking Rating |
|---|---|---|---|
| 44 | IR-1 | Excellent | Excellent |
| 45 | IR-2 | Excellent | Excellent |
| 46 | IR-3 | Excellent | Excellent |
| 47 | IR-4 | Excellent | Excellent |
| 48 | IR-5 | Excellent | Excellent |

The results reported in Table VII indicate that a wide variety of infrared absorbers is useful in this invention. The coating containing IR-5 did not adhere as strongly to the support as did the other coatings and did not hold up quite as well in the inking test.

EXAMPLES 49–54

The grained and anodized aluminum support described hereinabove was spin-coated at 1500 rpm with a solution consisting of 5 weight percent sorbitol in water and allowed to dry at room temperature. An imaging layer was applied by spin coating at 1500 rpm with a solution consisting of 2% by weight nitrocellulose, 1% by weight of IR-1 and 0.3% by weight of the cyan dye 2-(4-chlorophenyl)-3-[[4-diethylamino) -methylphenyl]imino]-1-propene-1,1,3-tricarbonitrile in a 70:30 mixture of methyl isobutyl ketone and ethanol. After drying, an integral stripping layer was appliedby spin coating at 1500 rpm with a coating composition as follows:

| Example No. | Polymer | Solvent |
|---|---|---|
| 49 | Polyvinyl alcohol | Water |
| 50 | (1)BMnWd (80:10:10) | Water |
| 51 | (2)AQ-38 | Water |
| 52 | (3)AAe (80:20) | Water |
| 53 | (4)Rubber cement | Toluene/Hexane |
| 54 | (5)MTH Filmguard Adhesive | None |

(1)An 80:10:10 terpolymer of butylacrylate:hydroxyethyl methacrylate:2-sulfoethylmethacrylate, sodium salt.
(2)A water-dispersible polyester available from Eastman Chemical Company.
(3)An 80:20 copolymer of acrylamide:2-aminoethyl methylacrylate hydrochloride.
(4)An adhesive rubber cement composition available from Avery Dennison Corporation, Framingham, MA.
(5)An adhesive composition available from MTH Corporation, Amherst, N.H.

Each plate was exposed to an imagewise modulated laser diode beam focused thereon. The laser wavelength was 830 run and the laser power was 100 mW. The linear writing speed of the laser beam was 87.8 cm per second and the pitch of the lines of the raster scan was 945 per centimeter. The exposure of the plate was 1.08 Joules per square centimeter. After exposure the stripping layer was removed by peeling with the aid of household transparent tape, except in the case of Example 54 where the stripping layer was self peeling. In each of Examples 49 to 54, the exposed areas provided a clear image of the exposure while the background (non-exposed) areas were completely clean.

Lithographic printing plates intended for long-run applications are most commonly comprised of a grained and anodized aluminum support having a hydrophilic surface and an imaging layer overlying such surface which is composed of a photosensitive polymer that is cross-linked by UV exposure through a suitable transparency. A lithographic printing surface is obtained by developing the imagewise exposed plate with an alkaline developing solution which removes the photopolymer from the non-exposed areas to reveal the underlying hydrophilic surface of the grained and anodized aluminum support. Such plates suffer from the disadvantages involved in the handling, storage and expense of the film intermediates required to serve as the transparency in the exposing step. Moreover, they suffer from the further disadvantage of requiring an alkaline developing solution and thereby generating undesirable effluents which must be discharged into the environment.

In contrast with the conventional printing plates described above, the present invention makes it feasible to prepare a lithographic printing plate directly from digital data without the need for intermediate transparencies. Relatively low exposures compared to other laser plate-making processes are required. The printing plates of this invention can be handled conveniently under roomlight both before and after laser exposure. Moreover, the plates can be imagewise exposed using inexpensive and highly reliable infrared diode lasers. Exposed images can be made extremely sharp by the use of tightly focused lasers. Unexposed areas are as robust to the lithographic printing process as the unexposed areas of conventional lithographic printing plates. In addition, the printing plates of this invention eliminate the need for an alkaline developing solution thereby saving time and eliminating the expense, maintenance and floor space of a plate processor.

The invention has been described in detail, with particular reference to certain preferred embodiments thereof, but it should be understood that variations and modifications can be effected within the spirit and scope of the invention.

What is claimed is:

1. A method of imaging a lithographic printing plate which can be imaged to form a lithographic printing surface without the use of an alkaline developing solution; said method consisting essentially of the following steps:

(1) providing a non-radiation-sensitive lithographic printing plate comprising a support having a porous hydrophilic surface and an oleophilic, non-radiation-sensitive imaging layer overlying said porous hydrophilic surface; said imaging layer comprising an oleophilic, infrared radiation-absorbing, heat-sensitive, film-forming composition which is readily removable from said porous hydrophilic surface prior to imagewise exposure by peeling or rubbing and which is adapted to form a lithographic printing surface as a result of imagewise exposure to absorbable infrared radiation and subsequent removal of the non-exposed areas to reveal the underlying porous hydrophilic surface, said film-forming composition comprising a film-forming polymeric binder and an infrared-absorbing agent, said polymeric binder being a polymer that flows when heated;

(2) imagewise exposing said lithographic printing plate to absorbable infrared radiation using an infrared-emitting laser, to effect localized generation of heat in the exposed areas of said imaging layer that is insufficient to remove by ablation all imaging layer material in said exposed areas but sufficient to cause said polymeric binder in said exposed areas to interact with said porous hydrophilic surface and to bond strongly thereto so as to provide a durable oleophilic image that is useful in lithographic printing; and (3) removing, without the use of an alkaline developing solution, the non-exposed areas of said imaging layer to thereby reveal the underlying porous hydrophilic surface.

2. A method as claimed in claim 1, wherein said lithographic printing plate is imaged by exposure through a transparency.

3. A method as claimed in claim 1, wherein said lithographic printing plate is imaged from digital information by the use of a laser beam.

4. A method as claimed in claim 1, wherein said non-exposed areas are removed by contact with lithographic printing ink.

5. A method as claimed in claim 1, wherein said non-exposed areas are removed by the steps of lamination and peel development.

6. The method of claim 1, wherein said polymeric binder is nitrocellulose.

7. A method as claimed in claim 1, wherein said support is comprised of aluminum which has been grained and anodized.

8. A method of imaging a lithographic printing plate; said method consisting essentially of the following steps:

(1) providing a non-radiation-sensitive lithographic printing plate comprising a support having a porous hydrophilic surface, an oleophilic, non-radiation-sensitive imaging layer overlying said porous hydrophilic surface, and an integral stripping layer overlying said imaging layer; said imaging layer comprising an oleophilic, infrared radiation-absorbing, heat-sensitive, film-forming composition which is readily removable from said porous hydrophilic surface prior to imagewise exposure and which is adapted to form a lithographic printing surface as a result of imagewise exposure to adsorbable infrared radiation and subsequent removal of the non-exposed areas to reveal the underlying porous hydrophilic surface, said film-forming composition comprising a film-forming polymeric binder and an infrared-absorbing agent, said polymeric binder being a polymer that flows when heated;

(2) imagewise exposing said lithographic printing plate to adsorbable infrared radiation using an infrared-emitting laser through said integral stripping layer to effect localized generation of heat in the exposed areas of said imaging layer sufficient to cause said polymeric binder in said exposed areas to interact with said porous hydrophilic surface and bond strongly thereto so as to provide a durable oleophilic image that is useful in lithographic printing, and (3) peeling said integral stripping layer off said imaging layer with said non-exposed areas adhering to said stripping layer and said exposed areas remaining strongly bonded to said support.

9. A method as claimed in claim 8, wherein said support is aluminum which has been grained and anodized, wherein said polymeric binder, is nitrocellulose, and wherein said integral stripping layer is comprised of polyvinyl alcohol.

10. A method as claimed in claim 1, wherein said porous hydrophilic surface comprises pores with a size in the range of from about 0.1 to about 10 micrometers.

11. A method as claimed in claim 1, wherein said support has a thickness in the range of from about 0.1 to about 1.0 millimeters.

12. A method as claimed in claim 1, wherein said imaging layer has a thickness in the range of from about 0.0003 to about 0.02 millimeters.

13. A method as claimed in claim 1, wherein said imaging layer has a thickness in the range of from about 0.001 to about 0.003 millimeters.

14. A method as claimed in claim 1, wherein said polymeric binder is cellulose acetate propionate.

* * * * *